United States Patent
Masuda

(10) Patent No.: US 8,105,870 B2
(45) Date of Patent: Jan. 31, 2012

(54) METHOD FOR MANUFACTURING SEMICONDUCTOR DEVICE, SEMICONDUCTOR DEVICE, SEMICONDUCTOR CIRCUIT, ELECTRO-OPTICAL DEVICE, AND ELECTRONIC APPARATUS

(75) Inventor: Takashi Masuda, Komatsu (JP)

(73) Assignee: Seiko Epson Corporation (JP)

( * ) Notice: Subject to any disclaimer, the term of this patent is extended or adjusted under 35 U.S.C. 154(b) by 422 days.

(21) Appl. No.: 12/056,366

(22) Filed: Mar. 27, 2008

(65) Prior Publication Data

US 2008/0237583 A1    Oct. 2, 2008

(30) Foreign Application Priority Data

Mar. 28, 2007   (JP) ................................. 2007-086099

(51) Int. Cl.
*H01L 51/40*   (2006.01)
(52) U.S. Cl. .... 438/99; 438/151; 438/780; 257/E51.006
(58) Field of Classification Search .................... 438/99, 438/151, 780
See application file for complete search history.

(56) References Cited

U.S. PATENT DOCUMENTS

| | | | |
|---|---|---|---|
| 6,184,319 B1 | 2/2001 | Sato et al. | |
| 6,472,082 B2 | 10/2002 | Kodemura | |
| 6,613,850 B1 | 9/2003 | Sato et al. | |
| 6,660,816 B2 | 12/2003 | Sato et al. | |
| 2004/0242825 A1* | 12/2004 | Shishido et al. | 526/309 |
| 2006/0006381 A1* | 1/2006 | Kelley et al. | 257/40 |
| 2007/0129473 A1* | 6/2007 | Shin et al. | 524/261 |
| 2008/0265214 A1* | 10/2008 | Steiger et al. | 252/500 |
| 2009/0230387 A1* | 9/2009 | Ohe et al. | 257/40 |

FOREIGN PATENT DOCUMENTS

| | | |
|---|---|---|
| JP | 62-105610 | 5/1987 |
| JP | 06-107736 | 4/1994 |
| JP | 10-120768 | 5/1998 |
| JP | 2004-63976 | 2/2004 |
| JP | 2004-063976 | 2/2004 |
| JP | 2006-297694 | 11/2006 |
| JP | 2006-321810 | 11/2006 |
| WO | WO98-18837 | 5/1998 |
| WO | 2006-129718 | 12/2006 |
| WO | WO2006-129718 | 12/2006 |

OTHER PUBLICATIONS

Amorphous Cycloolefin Polymers, Teiji KOHARA, The Society of Polymer Science, Japan, vol. 50/2001 (Nov. 1, 2001) with English translation.

* cited by examiner

*Primary Examiner* — Alexander Ghyka
(74) *Attorney, Agent, or Firm* — Harness, Dickey & Pierce, P.L.C.

(57) ABSTRACT

A method for manufacturing a semiconductor device includes: forming a source electrode and a drain electrode on a substrate; forming an organic semiconductor layer including a π conjugated organic compound at least between the source electrode and the drain electrode; applying an application liquid on the organic semiconductor layer, the application liquid being made of a polymer of an alicyclic compound dissolved in a paraffin hydrocarbon solvent that is a carbocyclic compound without having aromaticity; forming a gate insulation layer including the polymer of the alicyclic compound by removing the paraffin hydrocarbon solvent from the application liquid; and forming a gate electrode on the gate insulation layer.

5 Claims, 8 Drawing Sheets

METHOD FOR MANUFACTURING SEMICONDUCTOR DEVICE, SEMICONDUCTOR DEVICE, SEMICONDUCTOR CIRCUIT, ELECTRO-OPTICAL DEVICE, AND ELECTRONIC APPARATUS

The entire disclosure of Japanese Patent Application No. 2007-086099, filed Mar. 28, 2007 is expressly incorporated by reference herein.

BACKGROUND

1. Technical Field

The present invention relates to a method for manufacturing a semiconductor device, the semiconductor device, a semiconductor circuit, an electro-optical device, and an electronic apparatus.

2. Related Art

In recent years, researches on an organic device become more and more active because it is anticipated to be light weight, flexible, and at a low cost. In particular, an organic thin film transistor (hereinafter, abbreviated as "TFT") is increasingly expected to be applied to electric papers, wireless tags, plastic IC cards, and further, in fields of medical application such as biosensors for practical use.

As a process for manufacturing an organic TFT, vacuum processing such as vapor deposition, and a coating process such as spin coating and an inkjet method are applicable.

Since such coating process is simply and easily conducted in the atmosphere, it is said that it has more advantages than the vacuum processing in broadening areas and cost reduction.

A gate insulation layer formed by the coating process as the above is required to have conditions such as high characteristics as a TFT (an ON/OFF ratio, an S value, and an ON current value), low hygroscopicity, heat resistance, high-molecular weight, solvent selectivity, and a favorable film forming property. (e.g. JP-A-2006-297694)

For example, if polystyrene is used as a material forming a gate insulation layer, dielectric breakdown immediately occurs to the gate insulation layer in the atmosphere.

If polymethyl methacrylate (hereinafter, abbreviated as "PMMA") is used as the material forming a gate insulation layer, high hygroscopicity of PMMA causes deterioration of the TFT characteristics in the atmosphere.

Further, if a polymer that has high heat resistance is used as the material forming a gate insulation layer, the gate insulation layer becomes hard to dissolve in a solvent because the polymer has rigidity. As a result, the gate insulation layer cannot be formed.

Therefore, a material that is applicable and can satisfy the conditions of the gate insulation layer described above has not yet been found.

On the other hand, to improve TFT characteristics, a method to make a gate insulation layer thinner has been known.

However, the gate insulation layer made thin has a high incidence of dielectric breakdown, thereby having an issue in which devices lack reliability. Therefore, an organic TFT made of an insulating material that is hard to cause dielectric breakdown (with a high withstand voltage) even if being made thin is required.

SUMMARY

An advantage of the invention is to provide a semiconductor device superior in semiconductor characteristics without causing dielectric breakdown, a method for securely manufacturing the semiconductor device, a high performance semiconductor circuit provided with the semiconductor device, a high performance electro-optical device provided with the same, and a highly reliable electronic apparatus.

The above advantage is attained by following aspects of the invention.

A method for manufacturing a semiconductor device according to a first aspect of the invention includes: forming a source electrode and a drain electrode on a substrate; forming an organic semiconductor layer including a π conjugated organic compound at least between the source electrode and the drain electrode; applying an application liquid on the organic semiconductor layer, the application liquid being made of a polymer of an alicyclic compound dissolved in a paraffin hydrocarbon solvent that is a carbocyclic compound without having aromaticity; forming a gate insulation layer including the polymer of the alicyclic compound by removing the paraffin hydrocarbon solvent from the application liquid; and forming a gate electrode on the gate insulation layer.

The gate insulation layer can thus include a nonpolar substance and a nonpolar solvent, preventing an organic semiconductor material and a gate electrode material from diffusing into the gate insulation layer. As a result, a semiconductor device not causing dielectric breakdown, but having excellent semiconductor characteristics can be easily and securely obtained.

A method for manufacturing a semiconductor device according to a second aspect of the invention includes: forming a gate electrode on a substrate; applying an application liquid on the substrate so as to cover the gate electrode, the application liquid being made of a polymer of an alicyclic compound dissolved in a paraffin hydrocarbon solvent that is a carbocyclic compound without having aromaticity; forming a gate insulation layer including the polymer of the alicyclic compound by removing the paraffin hydrocarbon solvent from the application liquid; forming an organic semiconductor layer including a π conjugated organic compound on the gate insulation layer; and forming a source electrode and a drain electrode on the organic semiconductor layer.

The gate insulation layer can thus include a nonpolar substance and a nonpolar solvent, preventing an organic semiconductor material and a gate electrode material from diffusing into the gate insulation layer. As a result, a semiconductor device not causing dielectric breakdown, but having excellent semiconductor characteristics can be easily and securely obtained.

In this case, the polymer of the alicyclic compound may preferably have a cyclic atom arrangement in a side chain thereof.

Therefore, the side chain becomes rigid, improving heat resistance, but suppressing a microscopic molecular motion. As a result, ion diffusion from the gate electrode is suppressed, preventing the dielectric breakdown.

In this case, the polymer of the alicyclic compound may preferably have a cyclic atom arrangement in a main chain thereof.

Therefore, the main chain becomes rigid, making a glass-transition temperature high and suppressing the ion diffusion from the gate electrode.

In this case, the cyclic atom arrangement may preferably include a norbornene structure.

This makes steric hindrance of the alicyclic compound larger and easy to be an amorphous structure, providing a gate insulation layer that is homogeneous and transparent.

In this case, the cyclic atom arrangement may preferably include a cyclohexane structure.

This makes the steric hindrance of the alicyclic compound larger and easy to be an amorphous structure, providing a gate insulation layer that is homogeneous and transparent.

In this case, the polymer of the alicyclic compound may preferably have a copolymer of a structure having the cyclic atom arrangement and ethylene.

A glass-transition temperature and characteristics thus become controllable, effectively preventing the ion diffusion from the gate electrode.

In this case, the paraffin hydrocarbon solvent may preferably be in a liquid state at a normal temperature and a normal pressure condition.

This enables the semiconductor device to be manufactured in a liquid phase process, easily providing the semiconductor device.

In this case, the paraffin hydrocarbon solvent may preferably be made of at least one of heptane, octane, nonane, decane, undecane, dodecane, tridecane, tetradecane, pentadecane, hexadecane, and heptadecane.

Here, since a boiling point is from about 100 to 310 degrees Celsius, a favorable gate insulation layer is provided by spin coating or an inkjet method.

In this case, the paraffin hydrocarbon solvent may preferably be removed from the application liquid so as to remain at 0.1 wt % or less with respect to the polymer of the alicyclic compound.

This decreases a water-absorbing property of the gate insulation layer, preventing dissociation and diffusion of ions from the gate electrode.

In this case, the gate electrode may preferably be made of silver.

The semiconductor device can thus have sufficient conductivity, providing a semiconductor device that reliably drives.

A semiconductor device according to a third aspect of the invention includes: a gate electrode; an organic semiconductor layer including a π conjugated organic compound and having a channel region; a gate insulation layer located between the gate electrode and the organic semiconductor layer and including a paraffin hydrocarbon solvent and a polymer of an alicyclic compound that is dissolvable in the paraffin hydrocarbon solvent, the paraffin hydrocarbon solvent being at 0.1 wt % or less with respect to the polymer of the alicyclic compound; and a source electrode and a drain electrode making a carrier move through the channel region.

The gate insulation layer can thus include a nonpolar substance and a nonpolar solvent, preventing dissociation and diffusion of ions from the gate electrode while preventing diffusion of an organic semiconductor material from the organic semiconductor layer. As a result, the gate insulation layer is made thin, improving semiconductor characteristics. In addition, this can decrease a water absorption of the gate insulation layer, more securely preventing dissociation and diffusion of the ions from the gate electrode.

In this case, the gate insulation layer may preferably have a water absorption of 0.5% or less.

This can decrease affinity of the gate insulation layer and ions derived from the gate electrode, thereby securely preventing diffusion of the ions to the gate insulation layer.

A semiconductor circuit according to the invention includes the semiconductor device according to the third aspect of the invention.

Then, a high performance and compact semiconductor circuit allowing flexibility in design can be obtained.

An electro-optical device according to the invention includes the semiconductor circuit according to the above.

A high performance electro-optical device can be thus obtained.

An electronic apparatus according to the invention includes the electro-optical device according to the above.

Thus, a highly reliable electronic apparatus can be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
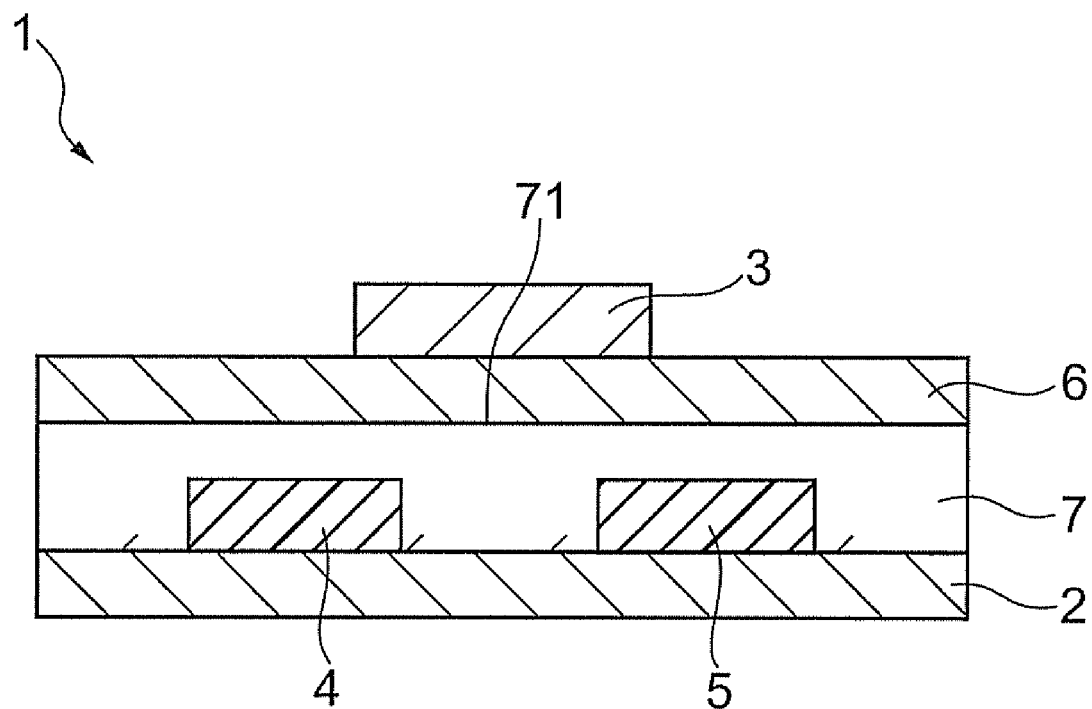
FIG. 1 is a sectional view schematically illustrating a semiconductor device according to a first embodiment of the invention.

A semiconductor device, a method for manufacturing the semiconductor device, a semiconductor circuit, an electro-optical device, and an electronic apparatus according to the invention will now be described in detail based on some preferred embodiments illustrated in the drawings.

First Embodiment

First, a semiconductor device according to a first embodiment will be described.

FIG. 1 is a longitudinal sectional view schematically showing a semiconductor device of the first embodiment, while FIGS. 2A through 2D are diagrams (longitudinal sectional views) for explaining a method for manufacturing the semiconductor device shown in FIG. 1.

Figure 2A:
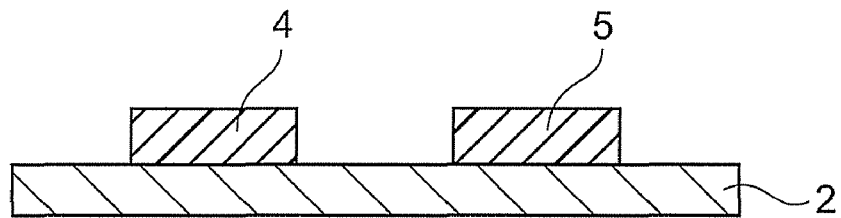
FIGS. 2A through 2D are diagrams (longitudinal sectional views) for explaining a method for manufacturing the semiconductor device shown in FIG. 1.
Figure 2B:
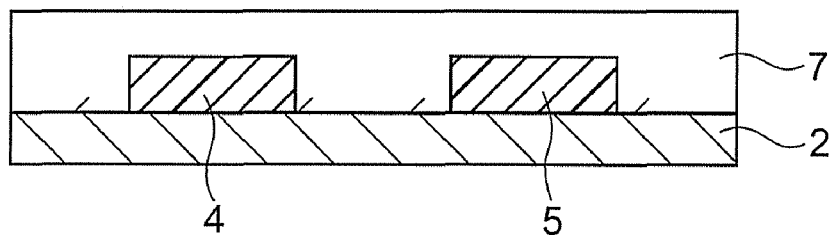
Figure 2C:
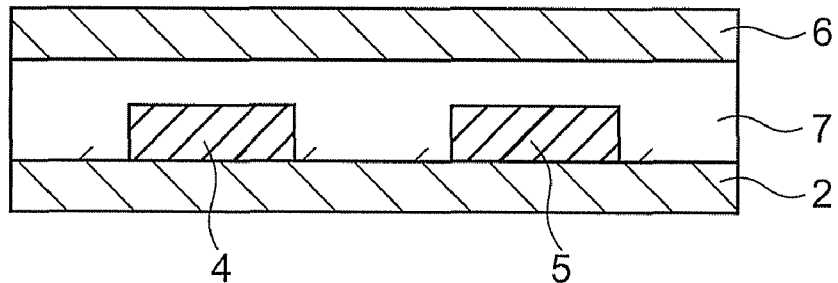
Figure 2D:
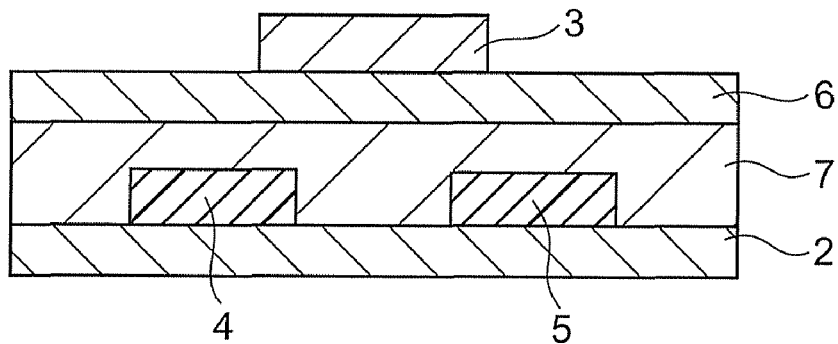

In the following description, the upper side in FIGS. 1 through 2D is described as "top", while the lower side is described as "bottom".

In a semiconductor device 1 shown in FIG. 1, a source electrode 4 and a drain electrode 5 are formed on a top surface of a substrate 2 so as to be apart from each other, and an organic semiconductor layer 7 is formed so as to cover them. On a top surface of the organic semiconductor layer 7, a gate insulation layer 6 is formed. Further, a gate electrode 3 is formed on a top surface of the gate insulation layer 6. That is, the semiconductor device 1 shown in FIG. 1 has a top gate bottom contact structure.

Each element will now be described in detail. However, the gate insulation layer 6 will be described in detail later.

The substrate 2 supports each layer (each element) making up the semiconductor device 1.

Examples of a material of the substrate 2 include a glass substrate; a plastic substrate (a resin substrate) containing polyethylene terephthalate (PET), polyethylene naphthalate (PEN), polyethersulphone (PES), aromatic polyester (liquid crystal polymer), polyimide (PI), or the like; a quartz substrate; a silicon substrate; a metal substrate; and a gallium arsenide substrate.

When the semiconductor device 1 needs to have flexibility, a plastic substrate or a thin metal substrate (with a relatively small thickness) is selected for the substrate 2.

An average thickness of the substrate is not particularly limited, but is preferably from 0.5 to 500 μm, and more preferably from 10 to 300 μm.

On the substrate 2, the source electrode 4 and the drain electrode 5 are formed.

A material composing the source electrode 4 and the drain electrode 5 is not particularly limited, but examples thereof to be used include, Cr, Al, Ta, Mo, Nb, Cu, Ag, Au, Pd, In, Ni, Nd, Co, or metal materials such as alloys including these materials, metal oxides, conductive organic materials.

An average thickness of the source electrode 4 and the drain electrode 5 is not particularly limited, but each can preferably have a thickness from 10 to 2000 nm, and more preferably from 50 to 1000 nm.

Further, on the substrate 2 provided with the source electrode 4 and the drain electrode 5, the organic semiconductor layer 7 is formed in contact with the source electrode 4 and the drain electrode 5 so as to cover them. The organic semiconductor layer 7 has a function to transfer electricity from the source electrode 4 to the drain electrode 5 in accordance with an electric field provided by the gate electrode 3.

As a material composing the organic semiconductor layer 7, an organic semiconductor material having a π conjugated system (organic material exhibiting semiconducting electrical conductivity) is used as a main constituent.

Organic semiconductor materials having a π conjugated system have an aromatic ring, thereby including a cohesive energy more than that of a paraffin hydrocarbon solvent. The organic semiconductor materials having a π conjugated system is thus hardly dissolved in the paraffin hydrocarbon solvent used to form the gate insulation layer 6 described later. Therefore, at an interface between the organic semiconductor layer 7 and the gate insulation layer 6, mutual diffusion of the organic semiconductor material and the gate insulating material does not occur. As a result, the organic semiconductor layer 7 and the gate insulation layer 6 that are homogeneously formed are obtained.

As the organic semiconductor material above, a low-molecular organic semiconductor material and a high-molecular organic semiconductor material are cited.

Examples of the low-molecular organic semiconductor material include naphthalene, anthracene, tetracene, pentacene, hexacene, phthalocyanine, perylene, hydrazone, triphenylmethane, diphenylmethane, stilbene, arylvinyl, pyrazoline, triphenylamine, triarylamine, or their derivatives.

Examples of the high-molecular organic semiconductor material include poly-N-vinylcarbazole, polyvinyl pyrene, fluorine-bithiophene copolymers (F8T2), or their derivatives, polyvinyl anthracene, polythiophene, poly (p-phenylenevinylene), pyrene-formaldehyde resin, and ethylcarbazole formaldehyde resin.

As the organic semiconductor material, the materials among the low-molecular organic semiconductor materials and/or the high-molecular organic semiconductor materials may be used singly or in combination.

In particular, the high-molecular organic semiconductor material enables the organic semiconductor layer 7 to be low profile and light in weight, and is superior in flexibility. Therefore, it is suitable to be used for a thin film transistor as a switching element of a flexible display or the like.

An average thickness of the organic semiconductor layer 7 is preferably from about 0.1 to about 1000 nm, more preferably from about 1 to about 500 nm, and further more preferably from about 1 to about 100 nm.

The organic semiconductor layer 7 does not have to be formed to cover the source electrode 4 and the drain electrode 5, but is required to be formed at least on a region between the source electrode 4 and the drain electrode 5 (a channel region 71).

The gate electrode 3 is provided on a position corresponding to a region between the source electrode 4 and the drain electrode 5 on the gate insulation layer 6.

As a material of the gate electrode 3, the same materials that have been cited as ones for the source electrode 4 and the drain electrode 5 may be used.

An average thickness of the gate electrode 3 is not particularly limited. However, it is preferably from 0.1 nm to 2000 nm, and more preferably from 1 nm to 1000 nm.

On the gate insulation layer 6, an absorptive layer (not shown) made of polyolefin-based polymer such as polyvinylphenol, polymethyl methacrylate, polystyrene, and polyvinyl alcohol may be formed.

The gate insulation layer 6 is formed on the top surface of the organic semiconductor layer 7. The gate insulation layer 6 insulates the gate electrode 3 from the source electrode 4 and the drain electrode 5.

The gate insulation layer 6 is in contact with the organic semiconductor layer 7 and the gate electrode 3. Therefore, when the gate insulation layer 6 is formed with an application liquid prepared by dissolving PMMA in an ester-based solvent, which is generally used as an insulating material, deterioration of semiconductor characteristics and dielectric breakdown may occur. It is considered that these may occur due to phenomena shown below.

That is, the organic semiconductor material composing the organic semiconductor layer 7 is also dissolved in the ester-based solvent. Therefore, when the gate insulation layer 6 is formed, the organic semiconductor material melts and leaks out of the top of the organic semiconductor layer 7. Then, mutual diffusion of the gate insulating material and the semiconductor material occur at the interface between the gate insulation layer 6 and the organic semiconductor layer 7. As a result, the gate insulation layer 6 and the organic semiconductor layer 7 become heterogeneous, thereby deteriorating the semiconductor characteristics.

Further, an insulating material having a polar group, for example, PMMA has a property to absorb moisture as it has a carbonyl group. Therefore, a material of the gate electrode formed by contacting the gate insulation layer 6 on its top is ionized because of moisture absorbed by the gate insulation layer 6, causing ion diffusion from the gate electrode 3 to the gate insulation layer 6. As a result, dielectric breakdown occurs.

As a result of dedicated researches to solve the issues such as the deterioration of the semiconductor characteristics and dielectric breakdown, the inventors have found that the issues described above can be cleared up once for all by using a nonpolar substance for the material composing the gate insulation layer 6 and changing the solvent to be used to a nonpolar solvent.

That is, the gate insulation layer 6 in the first embodiment is made of a material including a polymer of an alicyclic compound that is a carbocyclic compound not having aromaticity, and a small amount of the solvent dissolving the polymer of the alicyclic compound remains therein.

The polymer of the alicyclic compound has a cyclic atom arrangement in a main chain and/or a side chain.

The polymer of the alicyclic compound as the above is a nonpolar substance not having a polar group, thereby not dissolving in an alcohol solvent and an aquatic solvent that are used when the gate electrode 3 is formed. As a result, the gate insulation layer 6 that is homogeneous and uniform is obtained.

Further, the polymer of the alicyclic compound has excellent characteristics such as high resistance to pressure, low hygroscopicity, high heat resistance, and high-molecular weight.

Since some so-called cycloolefin polymers in which polymers of an alicyclic compound have a cyclic atom arrangement in a main chain or a side chain may have a small cohesive energy, they can be dissolved in the paraffin hydrocarbon solvent.

Further, the main chain is rigid, making a glass-transition temperature high. Since the alicyclic compound made of a carbon atom and a hydrogen atom only does not include a polar group, a water-absorbing property is deteriorated. Therefore, ion diffusion from the gate electrode 3 that is stacked on the gate insulation layer 6 is prevented. As a result, the gate insulation layer 6 is made thin.

Since the polymer of the alicyclic compound made of a carbon atom and a hydrogen atom only has a cyclic atom arrangement in a side chain, the side chain does not have a polar group, but has rigidity. Therefore, a so-called assisting effect of the side chain is weakened, suppressing a microscopic molecular motion. As a result, ion diffusion from the gate electrode 3 is suppressed, preventing dielectric breakdown.

The cyclic atom arrangement included in the polymer of the alicyclic compound preferably has a carbon number of from 3 to 20, more preferably from 4 to 15. As the examples, cyclopentane, cyclohexane, cycloheptane, cyclodecane, norbornene, dicyclopentadiene, tetracyclododecene, and the like are cited. These may be used in combination of two or more.

The cyclic atom arrangement as the above preferably includes norbornene or cyclohexane. Since the both have a bulky molecule structure, a film of a cycloolefin polymer is easily made to be an amorphous structure by steric hindrance. As a result, a gate insulation layer that is homogeneous and transparent is obtained.

The polymer of the alicyclic compound is preferably a block copolymer composed of a structure having a cyclic atom arrangement and a structure such as ethylene and propylene. According to the above, a polymeric ration of a molecule of ethylene or the like and the structure having the cyclic atom arrangement is adjustable, thereby easily preparing the copolymer that is dissolvable in the paraffin hydrocarbon solvent.

A glass-transition temperature (Tg) of the polymer of the alicyclic compound is preferably 80 degrees Celsius or more, more preferably 120 degrees Celsius or more. Generally, mobility and fluidity of polymers decrease at a temperature that is lower or equal to a glass-transition temperature, thereby making diffusion of a substance slow. Therefore, when the polymer of the alicyclic compound has the Tg described above, the ion diffusion from the gate electrode 3 is effectively prevented.

Further, a refractive index (n) of the polymer of the alicyclic compound is preferably in a range from 1.29 to 1.51. If the refractive index is in the range above, the cohesive energy of the polymer of the alicyclic compound is lessened, thereby ensuring dissolution of the polymer.

When a molecular weight of the polymer of the alicyclic compound is measured by gel permeation chromatography (GPC), a weight average molecular weight (Mw) in polystyrene conversion is preferably from $1 \times 10^3$ to $1 \times 10^7$, and more preferably from $1 \times 10^4$ to $1 \times 10^6$.

When the molecular weight is much lower than the lower limit of the range above, both the cohesive energy and the glass-transition temperature may decrease due to an effect of an end group. As a result, ion diffusion from the gate electrode 3 becomes hard to suppress.

When the molecular weight is much higher than the upper limit of the range above, the polymer may become hard to dissolve in the paraffin hydrocarbon solvent.

As the polymer of the alicyclic compound as the above, polymer compounds 1 to 6 shown in Formulae 1 to 6 are cited below, for example.

[Formula 1]

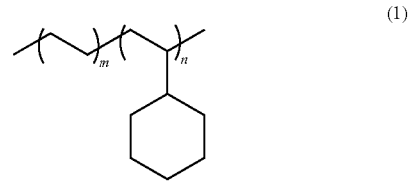

(In the formula, m+n indicates from 10 to 100,000, and m may be 0.)

[Formula 2]

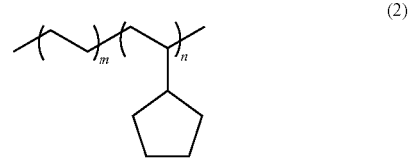

(In the formula, m+n indicates from 10 to 100,000, and m may be 0.)

[Formula 3]

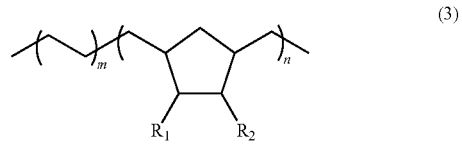

(In the formula, $R_1$ and $R_2$ respectively indicate a hydrogen atom and an alkyl group having a carbon number of from 1 to 20, while m+n indicates from 10 to 100,000, and m may be 0.)
[Formula 4]

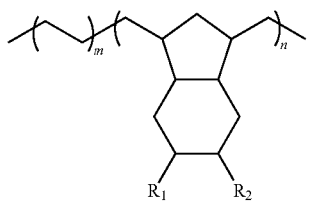

(4)

(In the formula, $R_1$ and $R_2$ respectively indicate a hydrogen atom and an alkyl group having a carbon number of from 1 to 20, while m+n indicates from 10 to 100,000, and m may be 0.)
[Formula 5]

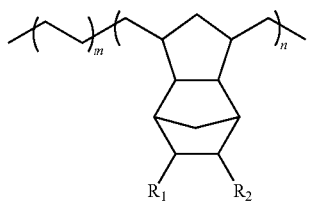

(5)

(In the formula, $R_1$ and $R_2$ respectively indicate a hydrogen atom and an alkyl group having a carbon number of from 1 to 20, while m+n indicates from 10 to 100,000, and m may be 0.)
[Formula 6]

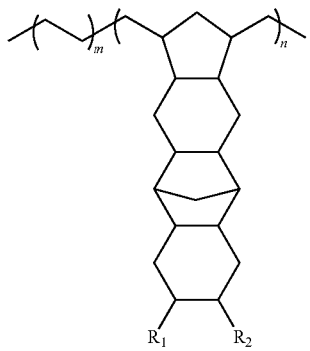

(6)

(In the formula, $R_1$ and $R_2$ respectively indicate a hydrogen atom and an alkyl group having a carbon number of from 1 to 20, while m+n indicates from 10 to 100,000, and m may be 0.)

Each of the polymer compounds 1 to 6 has a small cohesive energy and a refractive index within the range above, thereby surely dissolving in the paraffin hydrocarbon solvent.

The solvent remaining in the gate insulation layer 6 is not particularly limited as long as it is a paraffin hydrocarbon solvent. However, it is preferable that the solvent be in a liquid state at a normal temperature (20 degrees Celsius) and a normal pressure condition, that is, a hydrocarbon having a carbon number of from 5 to 17. Thus, a polymer including an alicyclic hydrocarbon can be easily dissolved.

Among such hydrocarbons having a carbon number of from 5 to 17, in particular, heptane, octane, nonane, decane, undecane, dodecane, tridecane, tetradecane, pentadecane, hexadecane, and heptadecane are preferable. The hydrocarbons as above have a boiling point of from about 100 to 310 degrees Celsius under a normal temperature and a normal pressure condition, thereby a favorable film quality is obtained by spin casting or an inkjet method.

The paraffin hydrocarbon solvent may also be used in combination of two or more kinds.

An amount of the paraffin hydrocarbon solvent remaining in the gate insulation layer 6 is preferably 0.1 weight percent or less with respect to the polymer of the alicyclic compound.

Because the paraffin hydrocarbon solvent in such an amount remains in the gate insulation layer 6, a water-absorbing property of the gate insulation layer 6 is deteriorated. Therefore, affinity of the paraffin hydrocarbon solvent and ions derived from the gate electrode 3 decreases, thereby suppressing dissociation and diffusion of the ions from the gate electrode 3.

When the remaining amount of the paraffin hydrocarbon solvent is higher than the upper limit above, the gate electrode 3 may not appropriately be stacked.

A water absorption of the gate insulation layer 6 is preferably 0.5% or less, and more preferably 0.2% or less. Therefore, the gate insulation layer 6 has extremely low affinity to water, securely preventing the ion diffusion from the gate electrode 3.

An average thickness of the gate insulation layer 6 is preferably from 10 to 300 nm, and more preferably from 50 to 250 nm. When PMMA that is a common insulating material is used, dielectric breakdown occurs as described above. Therefore, the film thickness of the gate insulation layer needs to be 500 nm or more. However, since dielectric breakdown does not occur in this embodiment as described above, the average thickness of the gate insulation layer 6 can be in the range above. As a result, the gate insulation layer 6 is made thin, improving an ON current value, an S value, and the semiconductor characteristics.

In the semiconductor device 1 as the above, when a gate voltage is applied to the gate electrode 3 while a voltage is applied in between the source electrode 4 and the drain electrode 5, a channel is formed near the interface of the gate insulation layer 6 in the organic semiconductor layer 7. As carriers (holes) move in this channel region 71, a current flows between the source electrode 4 and the drain electrode 7.

Namely, in an OFF state in which no voltage is applied to the gate electrode 3, even if some voltage is applied between the source electrode 4 and the drain electrode 5, only a very little current flows because carriers hardly exist in the organic semiconductor layer 7.

On the other hand, when a voltage is applied to the gate electrode 3, namely in an ON-state, electric charges are induced to a region where the organic semiconductor layer 7 faces the gate insulation layer 6, forming a channel (a path for carriers). When a voltage is applied between the source electrode 4 and the drain electrode 5 in this state, a current flows through the channel region 71.

The semiconductor device 1 as the above can be manufactured in the following manner, for example. Below, a method for manufacturing the semiconductor device 1 will be described.

The method for manufacturing the semiconductor device 1 shown in FIG. 1 includes a step [A1] for forming the source electrode 4 and the drain electrode 5 on the substrate 2, a step [A2] for forming the organic semiconductor layer 7 made of a material including a π conjugated system organic compound on the substrate 2 so as to cover the source electrode 4 and the drain electrode 5, a step [A3] for forming the gate insulation layer 6 on a surface of the organic semiconductor layer 7 in a side that is opposite from the substrate 2, and a step [A4] for forming the gate electrode 3 on the gate insulation layer 6.

[A1] Source Electrode and Drain Electrode Forming Step

As shown in FIG. 2A, the source electrode 4 and the drain electrode 5 are formed on a top surface of the substrate 2.

This formation can be achieved by the following methods, for example: chemical vapor deposition (CVD) including plasma CVD, thermal CVD, and laser CVD; vacuum deposition; electron beam deposition; pulse laser deposition; sputtering (low-temperature sputtering); dry plating such as ion plating; wet plating including electrolytic plating, immersion plating, and electroless plating; spraying; sol-gel processing; metalorganic deposition (MOD); joining of metal foil; and photolithography.

The source electrode 4 and the drain electrode 5 may also be formed on the substrate 2 by applying (or providing) a conductive material containing conductive particles or a conductive organic material for example, so as to form a coating film, and then performing post treatment (e.g. heating, irradiation of infrared rays, application of ultrasonic waves) to the coating film as necessary.

Examples of the conductive material containing conductive particles include a solution having metal microparticles dispersed therein and a polymer mixture containing conductive particles.

Examples of the conductive material containing a conductive organic material include a solution or dispersion liquid of the conductive organic material.

The conductive material can be applied (or provided) on the substrate 2 by the following coating methods, for example; a coating method such as spin coating, casting, micro gravure coating, gravure coating, bar coating, roll coating, wire-bar coating, dip coating, spray coating, and a printing method such as screen printing, flexographic printing, offset printing, and inkjet printing, micro contact printing. They can be employed singly or in combination of two or more of them.

[A2] Organic Semiconductor Layer Forming Step

Next, as shown in FIG. 2B, the organic semiconductor layer 7 is formed on the top surface of the substrate 2 so as to cover the source electrode 4 and the drain electrode 5.

In a case where the organic semiconductor layer 7 is made of a high-molecular organic semiconductor material, the organic semiconductor layer 7 can be formed by application methods such as spin coating and dipping, or printing methods such as ink jetting and screen printing.

Further, in a case where the organic semiconductor layer 7 is made of a low-molecular organic semiconductor material, the organic semiconductor layer 7 is formed as desired by forming a coating film with vapor deposition, an application method such as spin coating or dipping by making the low-molecular organic semiconductor material soluble using a precursor, or a printing method such as an inkjet method or screen printing, and then performing anneal processing to the coating film.

Note that the region in which the organic semiconductor layer 7 is formed is not limited to the structure shown in the drawings. Therefore the organic semiconductor layer 7 may be formed only in the region (the channel region 71) defined between the source electrode 4 and the drain electrode 5. When more than one semiconductor devices 1 are formed on the same substrate, this structure makes it possible to form the organic semiconductor layer 7 of each device 1 independently, thereby reducing leak current and crosstalk among the elements. In addition, this also reduces the amount of the organic semiconductor material to be used, thereby cutting manufacturing cost.

[A3] Gate Insulation Layer Forming Step

Next, as shown in FIG. 2C, the gate insulation layer 6 is formed on the organic semiconductor layer 7.

[A3-1] Application Liquid Preparing Step

First, the application liquid in which the polymer of the alicyclic compound is dissolved in the paraffin hydrocarbon solvent is prepared.

The application liquid is prepared by heating a mixed liquid of the polymer of the alicyclic compound and the paraffin hydrocarbon solvent so as to dissolve.

A concentration of the polymer of the alicyclic compound at this time is preferably from 1 to 10 wt %, and more preferably from 2 to 9 wt % with respect to the application liquid. When the polymer of the alicyclic compound has the concentration as the above, viscosity of the application liquid becomes low, and thus an inkjet method can be employed. As a result, when the semiconductor device 1 (in particular, the gate insulation layer 6 and the organic semiconductor layer 7) is manufactured, the application method does not need to be changed, thereby more simply and rapidly manufacturing the semiconductor device 1.

However, when the application liquid is brought to a room temperature after heat application for dissolving to prepare the application liquid, a precipitate may be generated. In this case, the precipitate is removed by filtering, for example. After the application liquid is filtered, the precipitate is not generated. The precipitate is a hardly-soluble component coating a pellet of the polymer of the alicyclic compound. The application liquid is filtered as the above, making it a stable solution.

[A3-2] Application Liquid Applying Step

Next, the application liquid is applied (supplied) on the organic semiconductor layer 7.

As a method for applying the application liquid, the application methods and the printing methods described in the step [A1] are cited. They can be employed singly or in combination of two or more. Accordingly, a coating layer (the gate insulation layer 6) on the organic semiconductor layer 7 is obtained.

As described above, the organic semiconductor layer 7 includes the organic semiconductor material having a π conjugated system. The organic semiconductor material having a π conjugated system hardly dissolves in the paraffin hydrocarbon solvent. Therefore, by forming the gate insulation layer 6 using the paraffin hydrocarbon solvent as the application liquid, mutual diffusion of respective materials is prevented at the interface of the gate insulation layer 6 and the organic semiconductor layer 7. As a result, the gate insulation layer 6 and the organic semiconductor layer 7 that are homogeneous are obtained, improving the semiconductor characteristics.

[A3-3] Solvent Removing Step

Next, after the application liquid is applied on the organic semiconductor layer 7, the solvent is removed by a solvent removal.

The solvent removal can be conducted by reduced-pressure drying, heat drying (firing), or the like for example.

The heat drying can be conducted by drying (firing) at a temperature from 50 to 100 degrees Celsius for 5 to 15 minutes.

The reduced-pressure drying is conducted by drying with a pressure of $1 \times 10^{-6}$ to $1 \times 10^4$ Pa at a temperature from 20 to 50 degrees Celsius for 5 to 15 minutes.

Through the solvent removal as the above, most of the paraffin hydrocarbon solvent is removed from the gate insulation layer 6. However, the paraffin hydrocarbon solvent of 0.1 weight percent or less with respect to the polymer of the alicyclic compound remains in the gate insulation layer 6.

According to the above, the gate insulation layer 6 made of the material including the polymer of the alicyclic compound is obtained.

[A4] Gate Electrode Forming Step

Lastly, as shown in FIG. 2D, the gate electrode 3 is formed on the gate insulation layer 6.

The gate electrode 3 can be formed in the same method as the source electrode 4 and the drain electrode 5 in the step [A1].

Through the steps described above, the semiconductor device 1 according to the first embodiment shown in FIG. 1 is obtained.

As the above, in the method for manufacturing the semiconductor device 1, it is preferable that a same method be employed to each step described above. In particular, it is preferable that the gate insulation layer 6 and the organic semiconductor layer 7 be formed by the same method. Then, each layer is formed without changing the forming method in each step, more simply, rapidly and securely providing the semiconductor device 1.

As such a method, an inkjet method or spin coating is preferable. By employing the inkjet method, a film thickness and composition can be freely arranged by the number of droplets and concentration of a solution to be discharged, thereby more simply providing a semiconductor device 1 as desired.

Second Embodiment

Next, a second embodiment of the semiconductor device will be described.

Figure 3:
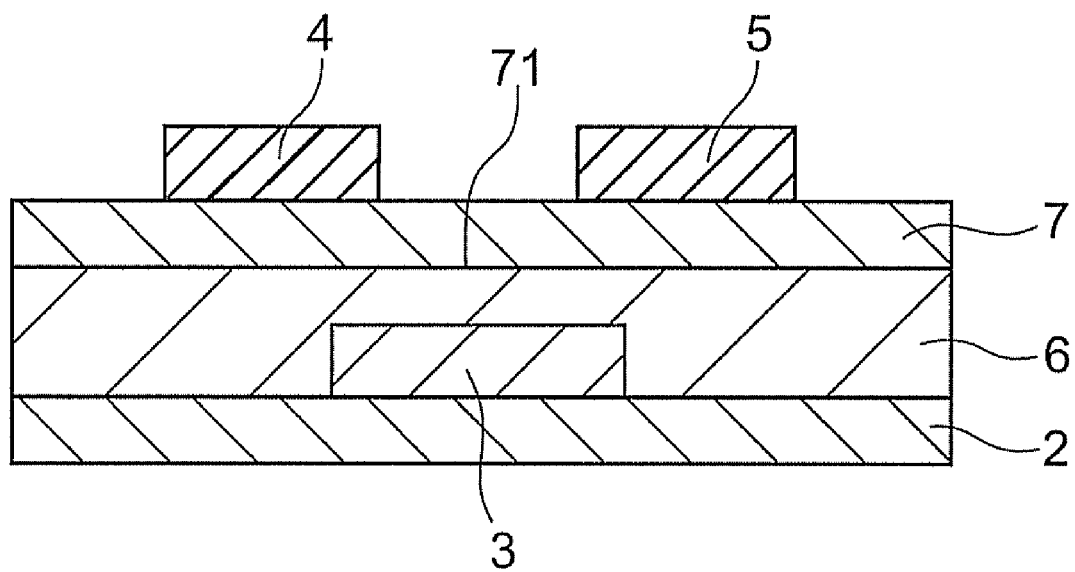
FIG. 3 is a sectional view schematically illustrating a semiconductor device according to a second embodiment of the invention.

FIG. 3 is a sectional view schematically showing a semiconductor device of the second embodiment, while FIGS. 4A through 4D are diagrams (longitudinal sectional views) for explaining a method for manufacturing the semiconductor device shown in FIG. 3.

Figure 4A:
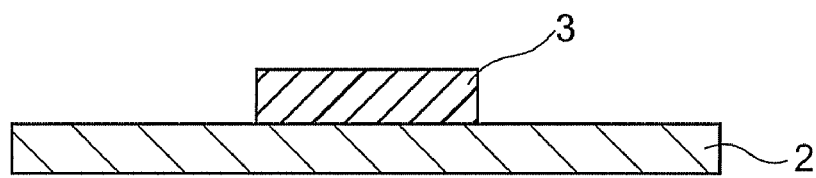
FIGS. 4A through 4D are diagrams (longitudinal sectional views) for explaining a method for manufacturing the semiconductor device shown in FIG. 3.
Figure 4B:
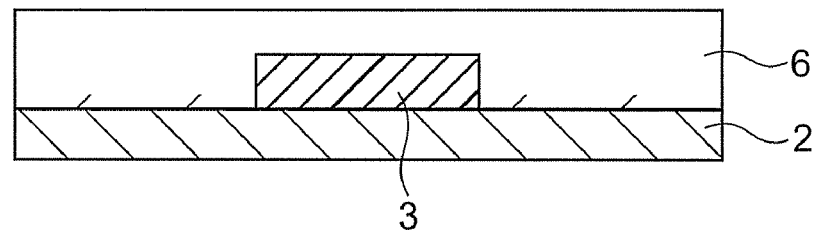
Figure 4C:
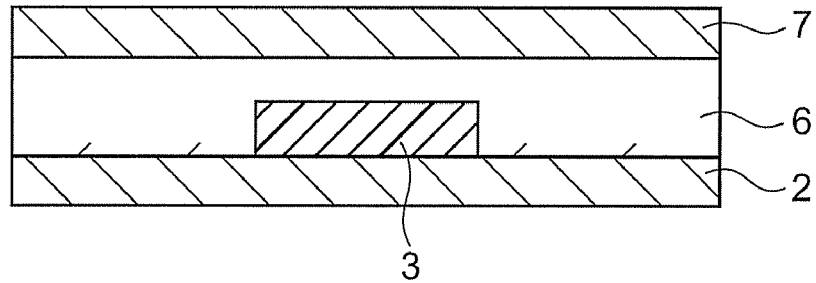
Figure 4D:
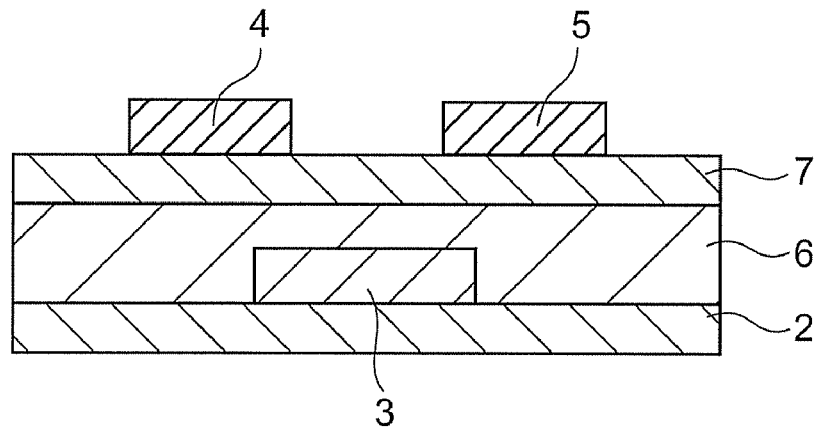

In the following description, the upper side in FIGS. 3 through 4D is described as "top", while the lower side is described as "bottom".

The following description of the second embodiment of the semiconductor device focuses primarily on differences from the first embodiment, and similar points will be omitted.

The semiconductor device 1 of the second embodiment is different in the overall configuration from the semiconductor device 1 of the first embodiment and is the same in other sections.

In the semiconductor device 1 shown in FIG. 3, the gate electrode 3 is formed on the top surface of the substrate 2. On the substrate 2, the gate insulation layer 6 is further formed so as to cover the gate electrode 3. On a top surface of the gate insulation layer 6, the organic semiconductor layer 7 is formed. On a top surface of the organic semiconductor layer 7, the source electrode 4 and the drain electrode 5 are formed apart from each other. That is, the semiconductor device 1 shown in FIG. 3 has a bottom gate top contact structure.

Therefore, unlike the semiconductor device 1 of the first embodiment, the semiconductor device 1 of the second embodiment can contact an electrode of an electro-optical device from the upper side of the semiconductor device 1.

Materials composing each layer, film thickness, and the like are the same as those of the corresponding layer in the first embodiment.

The semiconductor device 1 of the second embodiment also has the same performance and advantages as those of the semiconductor device 1 of the first embodiment.

The semiconductor device 1 as the above can be manufactured in the following manner, for example.

Now, a method for manufacturing the semiconductor device according to the second embodiment will be described with reference to FIGS. 4A to 4D.

The method for manufacturing the semiconductor device 1 shown in FIGS. 4A to 4D includes a step [B1] for forming the gate electrode 3 on the substrate 2, a step [B2] for forming the gate insulation layer 6 on the substrate 2 so as to cover the gate electrode 3, a step [B3] for forming the organic semiconductor layer 7 on the top surface of the gate insulation layer 6, and a step [B4] for forming the source electrode 4 and the drain electrode 5 on the top surface of the organic semiconductor layer 7.

[B1] Gate Electrode Forming Step

As shown in FIG. 4A, the gate electrode 3 is formed on the substrate 2.

The gate electrode can be formed in the same manner as the step [A4] described above.

[B2] Gate Insulation Layer Forming

As shown in FIG. 4B, the gate insulation layer 6 is formed on the substrate 2 so as to cover the gate electrode 3.

The gate insulation layer 6 can be formed in the same manner as the step [A3] described above.

[B3] Organic Semiconductor Layer Forming Step

As shown in FIG. 4C, the organic semiconductor layer 7 is formed on the gate insulation layer 6.

The organic semiconductor layer 7 can be formed in the same manner as the step [A2] described above.

[B4] Source Electrode and Drain Electrode Forming Step

As shown in FIG. 4D, the source electrode 4 and the drain electrode 5 are formed on the organic semiconductor layer 7.

The source electrode and the drain electrode can be formed in the same manner as the step [A1] described above.

Through the steps described above, the semiconductor device 1 of the second embodiment shown in FIG. 3 is obtained.

In the method for manufacturing the semiconductor device 1 according to the second embodiment, it is preferable that a same method be employed to each step described above similarly to the first embodiment.

Semiconductor Circuit and Electro-optical Device

Next, an electro-optical device equipped with an active matrix device (semiconductor circuit according to the invention) including the semiconductor device 1 as described above will be described using an electrophoretic display device as an example.

Figure 5:
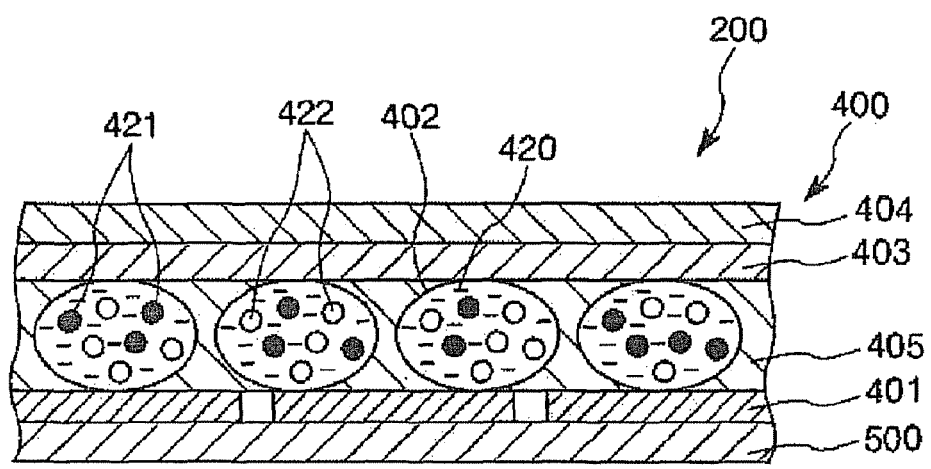
FIG. 5 is a longitudinal sectional view illustrating an electrophoretic display employing a display provided with the semiconductor device according to the invention.
Figure 6:
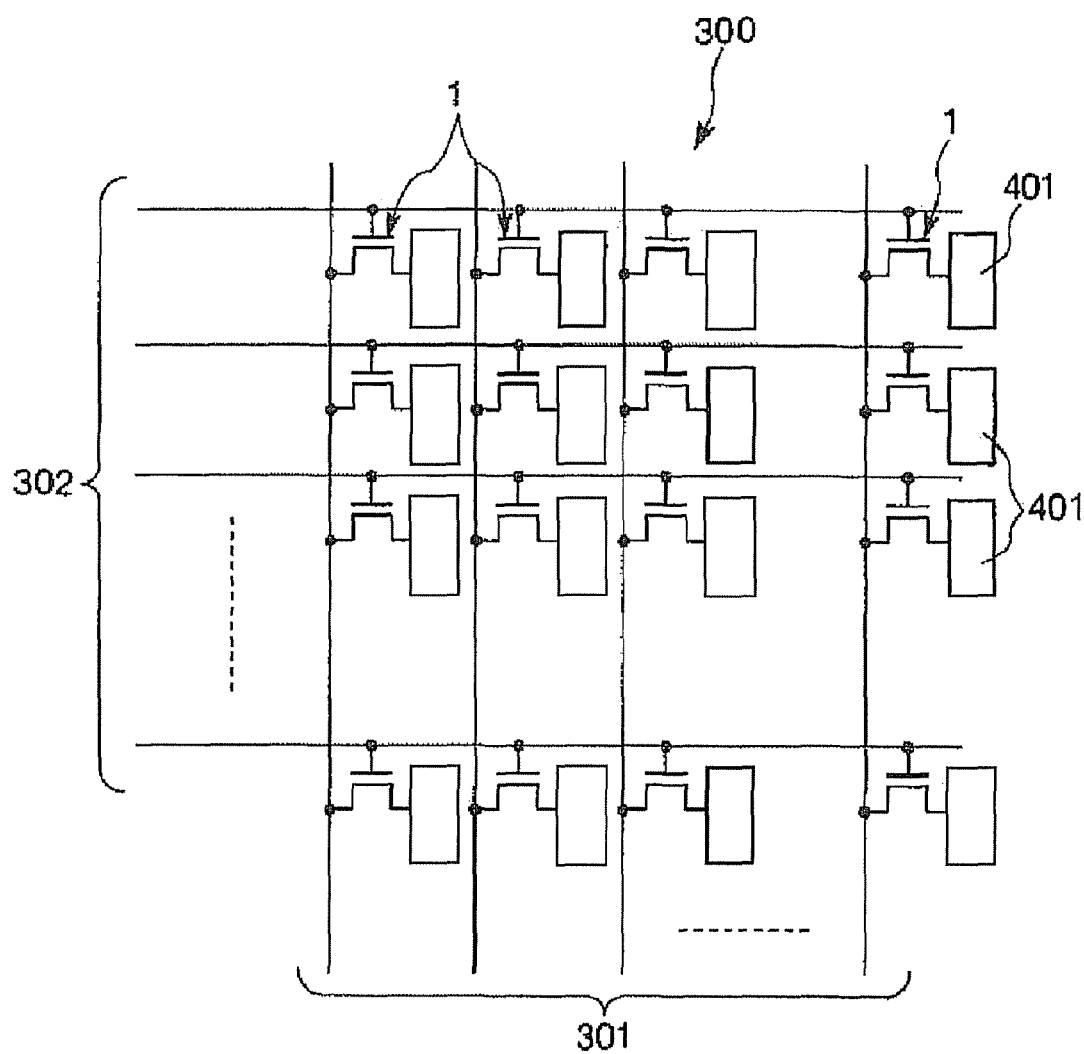
FIG. 6 is a block diagram showing a structure of an active matrix device included in the electrophoretic display shown in FIG. 5.

FIG. 5 is a longitudinal sectional view of an embodiment of the electrophoretic display device, and FIG. 6 is a block diagram showing an active matrix device included in the electrophoretic display device shown in FIG. 5.

An electrophoretic display device 200 shown in FIG. 5 includes an active matrix device formed on a substrate 500 and an electrophoretic display portion 400 electrically coupled to the active matrix device.

As shown in FIG. 6, an active matrix device 300 includes a plurality of data lines 301, a plurality of scanning lines 302, which are mutually-perpendicular, and the semiconductor device 1 that is installed about each of intersection points of the data lines 301 with the scanning lines 302.

Further, the gate electrode 3 included in the semiconductor device 1 is coupled to the scanning lines 302, the source electrode 4 is coupled to the data lines 301, and the drain electrode 5 is coupled to a pixel electrode (an individual electrode) 401 described later.

As shown in FIG. 5, the electrophoretic display portion 400 includes the pixel electrode 401, a microcapsule 402, a transparent electrode (a common electrode) 403 and a transparent substrate 404 which are sequentially formed as layers on the substrate 500.

The microcapsule 402 is fixed between the pixel electrode 401 and the transparent electrode 403 by a binder member 405.

The pixel electrode 401 is divided so as to be arrayed in a matrix, that is, orderly in rows and columns.

Each microcapsule 402 includes an electrophoretic dispersion liquid 420 that includes a plurality of electrophoretic particles having different characteristics. In this embodiment, two kinds of electrophoretic particles having different charges and colors (color phases) from each other, namely, electrophoretic particles 421 and 422, are encapsulated.

In the electrophoretic display device 200 as the above, when a selection signal (selection voltage) is supplied to one or more of the scanning lines 302, the semiconductor device 1 that is coupled to the scanning lines 302 supplied with the selection signal (selection voltage) is switched on.

The data lines 301 coupled to the semiconductor device 1 are thus electrically conducted to the pixel electrodes 401. Here, if desired data (voltage) is supplied to the data lines 301, the data (voltage) is supplied to the pixel electrode 401.

This generates an electric field between the pixel electrodes 401 and the transparent electrode 403. In accordance with the direction and strength of the electric field, and characteristics of the electrophoretic particles 421 and 422, the electrophoretic particles 421 and 422 electrophoretically move toward either of the electrodes.

On the other hand, if the supply of the selection signal (selection voltage) to the scanning lines 302 is stopped, the semiconductor device 1 is switched off and the data lines 301 and the pixel electrodes 401 coupled to the semiconductor device 1 are electrically disconnected.

Accordingly, by supplying or stopping the selection signal to the scanning lines 302 and by supplying or stopping data to the data lines 301 in an appropriate combination, a desirable image (information) can be displayed on a display side (the transparent substrate 404 side) of the electrophoretic display 200.

In particular, in the electrophoretic display 200 according to the embodiment, the electrophoretic particles 421 and 422 are allowed to have different colors from each other, making it possible to display multiple grayscale images.

Further, the electrophoretic display device 200 includes the active matrix device 300, selectively and securely switching on or off the semiconductor device 1 coupled to the specific scanning line 302. This can prevent a cross talk, and increase the speed of circuit operation, thereby improving the quality of images (information).

Furthermore, the electrophoretic display device 200 according to the embodiment operates at a low driving voltage, enabling electric power saving.

The electro optical device equipped with the active matrix device including the semiconductor device 1 described above is applied not only to the above electrophoretic display device 200, but also can be applied to displays such as a liquid crystal device, and an organic or inorganic EL device, or a light emission device, for example.

Further, in each of the embodiments above, the semiconductor devices including two gate electrodes are respectively described. However, the semiconductor device according to the invention may include three or more gate electrodes.

Electronic Apparatus

The electrophoretic display device 200 can be mounted to various electronic apparatuses. Electronic apparatuses equipped with the electrophoretic display device 200 according to the invention will now be described.

Electronic Paper

First, an electronic paper to which the electronic apparatus of the invention is applied will be described.

Figure 7:
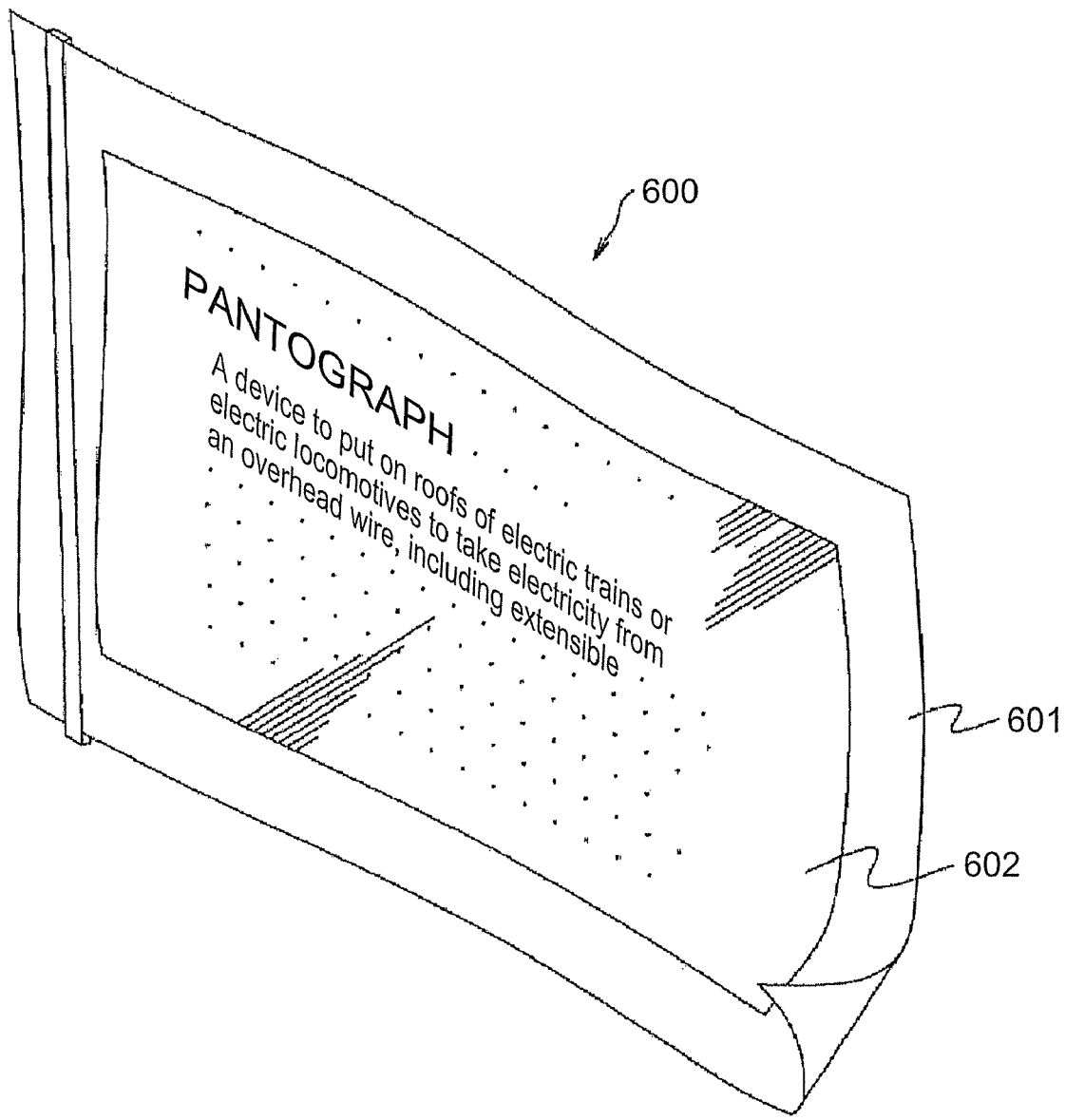
FIG. 7 is a perspective view illustrating an electronic paper provided with an electronic apparatus according to the invention.

FIG. 7 is a perspective view illustrating an electronic paper to which the electronic apparatus is applied.

An electronic paper 600 shown in the figure includes a body 601 and a display unit 602. The body 601 is composed of a rewritable sheet having a texture and flexibility similar to those of a paper.

In the electronic paper 600, the display unit 602 includes the electrophoretic display device 200 described above.

Display

Next, a display to which the electronic apparatus of the invention is applied will be described.

Figure 8A:
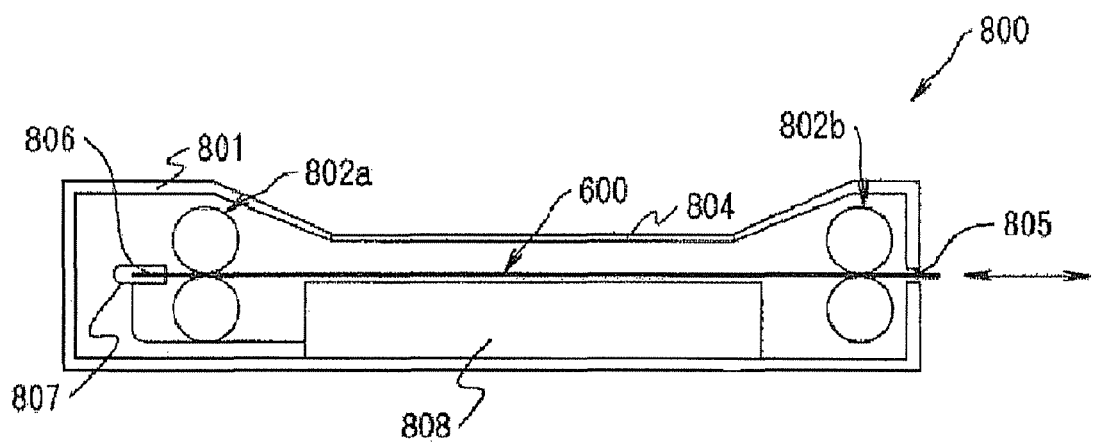
FIGS. 8A and 8B are perspective views illustrating a display provided with the electronic apparatus according to the invention.
Figure 8B:
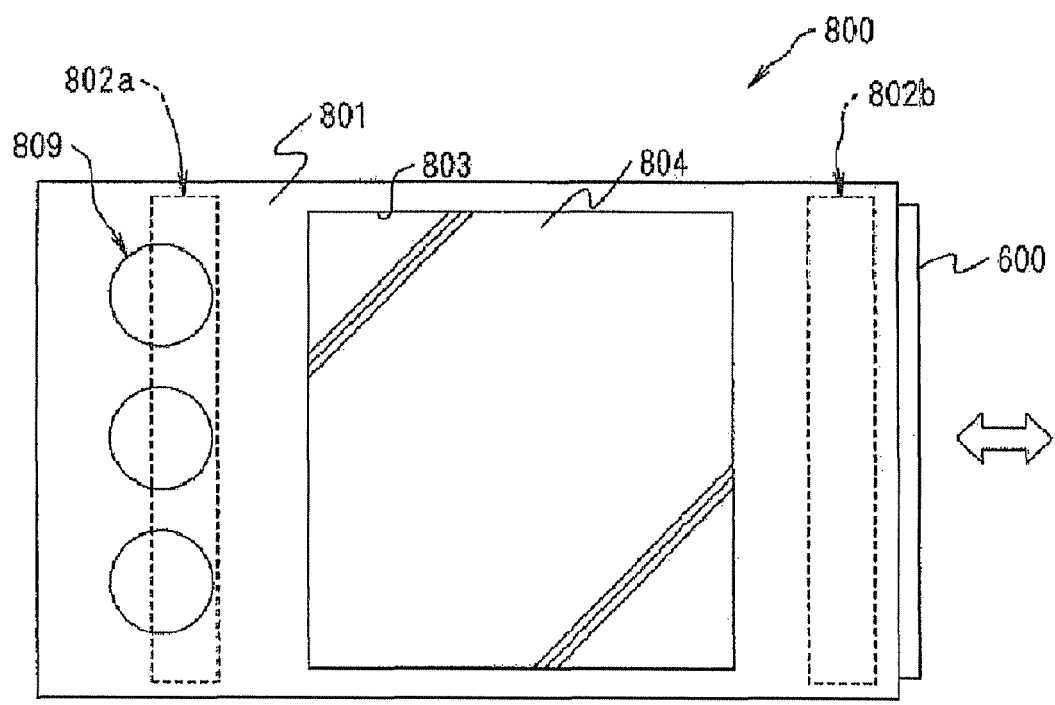

FIGS. 8A and 8B are diagrams illustrating a display to which the electronic apparatus of the invention is applied. FIG. 8A is a sectional view while FIG. 8B is a plan view.

A display 800 shown in this figure includes a body 801 and the electronic paper 600 that is detachably provided to the body 801. The electronic paper 600 has the same structure as the above, that is, the one shown in FIG. 7.

The body 801 has an insertion slot 805 on its side (right side in the figure) into which the electronic paper 600 is insertable. The body 801 also has a pair of feed rollers 802a and a pair of feed rollers 802b therein. When the electronic paper 600 is inserted through the insertion slot 805 into the body 801, the electronic paper 600 is fed to be set in the body 801 in a manner being sandwiched by the pairs of feed rollers 802a and 802b.

The body 801 also has an opening 803 in a rectangular shape on the display side of the body 801 (front side in FIG. 8B). A transparent glass plate 804 is fitted in the opening 803. Accordingly, the electronic paper 600 set in the body 801 is visible from the outside of the body 801. In other words, the display 800 is provided with a display by making the electronic paper 600 set in the body 801 visible through the transparent glass plate 804.

Also, a terminal 806 is provided at an end in the inserting direction of the electronic paper 600 (left side in the figure). Inside the body 801, a socket 807 is provided. The socket 807 is coupled to the terminal 806 when the electronic paper 600 is fed into the main body 801. The socket 807 is electrically coupled to a controller 808 and a control part 809.

The electronic paper 600 is detachably set in the body 801 of the display 800, so that the electronic paper 600 can be also used out of the body 801 for portable use.

In the display 800, the electronic paper 600 includes the electrophoretic display 200 described above.

Note that the application of the electronic apparatus of the invention is not limited to those described above. Examples of the application include a television, a video tape recorder of a view-finder type or a monitor viewing type, a car navigation system, a pager, a personal digital assistance, an electronic calculator, an electronic newspaper, a word processor, a personal computer, a workstation, a picture phone, a POS terminal, and a device equipped with a touch panel. The electrophoretic display 200 can be applied to a display of the above various electronic apparatuses.

The method for manufacturing a semiconductor device, the semiconductor device, the semiconductor circuit, the electro-optical device, and the electronic apparatus according to the invention have been described as above, however, they are not intended to limit the invention.

For example, each of components in the method for manufacturing a semiconductor device, the semiconductor device, the semiconductor circuit, the electro-optical device, and the electronic apparatus can be substituted by a given element that has a function similar to the above, and a given structure may be added.

EXAMPLES

Specific examples of the invention will now be described.
1. Method for Manufacturing a Semiconductor Device
Manufacturing a Semiconductor Device

Example 1

[1] Source Electrode and Drain Electrode Forming Step

First, a plastic substrate was prepared and cleaned with ethanol so as to degrease its surface.

A source electrode and a drain electrode were formed on the plastic substrate by depositing gold. After the source electrode and the drain electrode were formed, the plastic substrate having the source electrode and the drain electrode formed thereon was immersed in isopropyl alcohol and subjected to an ultrasonic cleaning for 5 minutes. After the cleaning, the plastic substrate was dried at 60 degrees Celsius for 10 minutes.

[2] Organic Semiconductor Layer Forming Step

Next, fluorene-bithiophene copolymer (American Dye Source-made F8T2, hereinafter, abbreviated as "F8T2") was dissolved in toluene so as to prepare a 0.5 wt % F8T2 solution. The F8T2 solution was supplied on the source electrode, the drain electrode, and the substrate by spin casting so as to form a F8T2 film having a thickness of 20 nm as a layer.

The spin casting was conducted under following conditions: an upslope time of 1 second, a speed of 2000 rpm for 60 seconds, and a downslope time of 2 seconds.

After the F8T2 film was formed, the substrate having the F8T2 film layered thereon was dried at 60 degrees Celsius for 10 minutes.

[3] Gate Insulation Layer Forming Step

Cycloolefin polymer (Zeon Corporation-made ZEONEX330R, which has Tg123 degrees Celsius, a water absorption of 0.01%, and a refractive index of 1.509) was dissolved in octane so as to be at a concentration of 4 wt %. At that time, the cycloolefin polymer was dissolved by heat application at 80 degrees Celsius for one hour. After the dissolution, the cycloolefin polymer was brought to a room temperature, and then filtered with a 0.2 μm thick filter. An application liquid including cycloolefin polymer was thus prepared.

The application liquid obtained as above was applied on the F8T2 film by spin casting. The spin casting was performed under the same conditions as the above. After the application, the cycloolefin polymer film was dried at 60 degrees for 10 minutes.

Thus, a gate insulation layer including cycloolefin polymer in a thickness of 170 nm was formed.

A concentration of octane in the gate insulation layer was 0.01 wt % with respect to the cycloolefin polymer.

[4] Absorptive Layer Forming Step

Polyvinylphenol was dissolved in isopropyl alcohol to have a concentration of 0.5 wt % so as to prepare a polyvinylphenol solution. The polyvinylphenol solution was applied on the gate insulation layer by spin casting. The spin casting was performed under the same conditions as the above.

After the application, the polyvinylphenol absorptive layer was dried at 60 degrees Celsius for 5 minutes, providing an absorptive layer in a thickness of 10 nm.

[5] Gate Insulation Layer Forming Step

Lastly, a silver colloidal ink was applied on the gate insulation layer by an inkjet method so as to pattern a gate electrode. After the patterning, the silver colloidal ink was fired at 80 degrees Celsius for 10 minutes. A gate electrode including silver as a constituent was thus obtained.

Accordingly, the semiconductor device according to the first embodiment as shown in FIG. 1 was obtained. Here, a channel of the semiconductor device was 1000 μm in width and 10 μm in length.

Example 2

A semiconductor device was obtained in the same manner as Example 1 except for altering the octane to decane.

Example 3

A semiconductor device was obtained in the same manner as Example 1 except for altering the octane to dodecane.

Example 4

A semiconductor device was obtained in the same manner as Example 1 except that [3] Gate Insulation Layer Forming Step was conducted as follows.

[3] Gate Insulation Layer Forming Step

A polymer compound 7 shown below was dissolved in octane so as to be at a concentration of 4 wt %. At that time, the polymer compound 7 was dissolved by heat application at 85 degrees Celsius for two hours. After the dissolution, the polymer compound 7 was brought to a room temperature, and then filtered with a 0.2 μm thick filter. An application liquid including the polymer compound 7 was thus prepared.

The polymer compound 7 had a weight-average molecular weight of 50000 when measured by GPC.

[Formula 7]

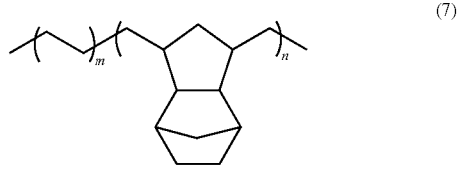

The application liquid obtained as above was applied on the F8T2 film by spin casting. The spin casting was performed under the same conditions as those in Example 1. After the application, the film of the polymer compound 7 was dried at 60 degrees Celsius for 10 minutes.

Thus, a gate insulation layer including the polymer compound 7 in a thickness of 170 nm was formed.

A concentration of the octane in the gate insulation layer was 0.01 wt % with respect to the polymer compound 7.

Example 5

The semiconductor device shown in FIG. 3 was obtained in the same manner as Example 1 except that a gate electrode, a gate insulation layer, an organic semiconductor layer, an absorptive layer, and source and drain electrodes were sequentially formed as layers in this order on a substrate.

Example 6

A semiconductor device was obtained in the same manner as Example 1 except for altering the F8T2 to polyquaterthiophene (American Dye Source-made 12PQT, hereinafter, abbreviated as "PQT-12"), and making the gate insulation layer be 200 nm in thick.

Example 7

A semiconductor device was obtained in the same manner as Example 1 except for altering the F8T2 to PQT-12, and making the gate insulation layer be 300 nm in thick.

Comparative Example 1

A semiconductor device was obtained in the same manner as Example 1 except for altering the application liquid to an application liquid in which PMMA (Tg120 degrees Celsius, water absorption of 2%, a refractive index of 1.49) was dissolved in butyl acetate. The gate insulation layer had a thickness of 500 nm.

Comparative Example 2

A semiconductor device was obtained in the same manner as Example 1 except for altering the cycloolefin polymer to a polymer not having an alicyclic compound (polyethylene). The gate insulation layer had a thickness of 500 nm.

Comparative Example 3

A semiconductor device was obtained in the same manner as Example 6 except for altering the application liquid to an application liquid in which PMMA was dissolved in butyl acetate. The gate insulation layer had a thickness of 500 nm.

2. Evaluation on Semiconductor Characteristics

Transfer characteristics of the semiconductor device obtained in each of the examples and the comparative examples were measured with a semiconductor parameter analyzer (4156C precision semiconductor parameter analyzer made by Agilent Technologies).

A drain current was measured under the conditions such as application of the drain voltage of −5 V or −40 V in a nitrogen atmosphere when the gate voltage was swept from +10 V to −40 V. From the measurement results, mobility, an ON current value, and an ON/OFF ratio are obtained as shown below.

Figure 9:
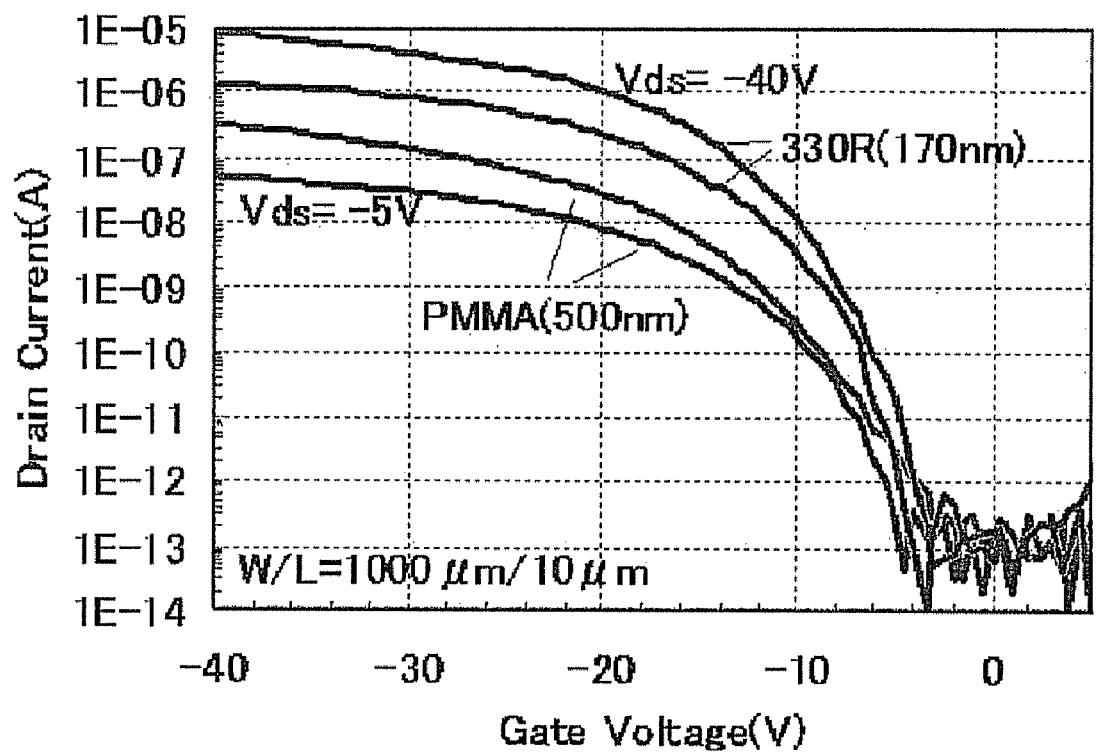
FIG. 9 is an $I_D$-$V_G$ diagram illustrating a transfer characteristic of the semiconductor device according to the invention.

The results are shown in Table 1 and FIG. 9. Further, FIG. 9 shows the results of Example 1 and Comparative Example 1 as representative results. However, for Examples 2 to 6 and Comparative Examples 2 and 3, similar graphs to FIG. 9 were obtained.

(1) Mobility

A threshold voltage was obtained from an intercept of a straight line in a graph in FIG. 9, and mobility of a transistor in a saturation area was calculated from a slope of the straight line.

(2) ON Current Value

When the gate voltage was −40 V, and a potential difference of the source and drain electrodes was 40 V, a value of a current flowing between the source electrode and the drain electrode was measured.

(3) ON/OFF Ratio

An ON/OFF ratio was obtained from a ratio of the drain current between when the gate voltage was 0 V and when the gate voltage was −40V.

TABLE 1

|  | Insulation film thickness (nm) | Mobility ($cm^2/Vs$) | ON/OFF ratio | ON current value (μA) |
|---|---|---|---|---|
| Example 1 | 170 | $2.0 \times 10^{-2}$ | $1 \times 10^8$ | 8.6 |
| Example 2 | 170 | $1.9 \times 10^{-2}$ | $1 \times 10^8$ | 8.3 |
| Example 3 | 170 | $2.0 \times 10^{-2}$ | $1 \times 10^8$ | 8.5 |
| Example 4 | 170 | $2.3 \times 10^{-2}$ | $1 \times 10^8$ | 8.7 |
| Example 5 | 170 | $2.0 \times 10^{-2}$ | $1 \times 10^8$ | 8.6 |
| Comparative Example 1 | 500 | $2.5 \times 10^{-3}$ | $1 \times 10^6$ | 0.6 |
| Comparative Example 2 | 500 | $2.4 \times 10^{-3}$ | $1 \times 10^6$ | 0.7 |
| Example 6 | 200 | $2.7 \times 10^{-3}$ | $5 \times 10^4$ | 1.9 |
| Example 7 | 300 | $2.3 \times 10^{-3}$ | $1 \times 10^5$ | 1.0 |
| Comparative Example 3 | 500 | $6.9 \times 10^{-4}$ | $1 \times 10^4$ | 0.3 |

As shown in Table 1, the semiconductor devices in Examples were superior in semiconductor characteristics to those of Comparative Examples.

In particular, Examples 1 to 5 had mobility improved 8 times more than that of Comparative Examples 1 and 2. Further, Examples 6 and 7 had mobility improved about 3 to 4 times more than that of Comparative Example 3.

Furthermore, every Example had favorable results on both the ON current value and ON/OFF ratio compared to Comparative Examples.

As shown in FIG. 9, the gate insulation layer was made thin, improving the S values of the semiconductors in respective Examples.

Accordingly, when the thickness of the gate insulation layer in Examples 1 to 5 was made to be about one thirds of the thickness of the gate insulation layer in Comparison Examples 1 and 2, excellent characteristics were also obtained. Similarly, even when the thickness of the gate insulation layer in Examples 6 and 7 was made to be about a half of the thickness of the gate insulation layer in Comparison Example 3, excellent characteristics were obtained.

What is claimed is:

1. A method for manufacturing a semiconductor device, comprising:
   forming a source electrode and a drain electrode on a substrate;
   forming an organic semiconductor layer including a π conjugated organic compound at least between the source electrode and the drain electrode;
   applying an application liquid on the organic semiconductor layer, the application liquid being made of a polymer of an alicyclic compound dissolved in a paraffin hydrocarbon solvent that is a carbocyclic compound without having aromaticity;
   forming a gate insulation layer including the polymer of the alicyclic compound by removing the paraffin hydrocarbon solvent from the application liquid; and
   forming a gate electrode on the gate insulation layer, wherein the alicyclic compound is one compound selected from the group consisting of:

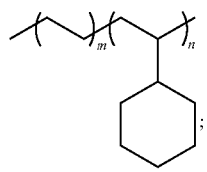
(1)

wherein $R_1$ and $R_2$, respectively, indicate a hydrogen atom and an alkyl group having a carbon number of from 1 to 20, and m+n is in the range 10 to 100,000, and m can be zero.

2. The method for manufacturing a semiconductor device according to claim 1, wherein the paraffin hydrocarbon solvent is in a liquid state at a normal temperature and a normal pressure condition.

3. The method for manufacturing a semiconductor device according to claim 1, wherein the paraffin hydrocarbon solvent is removed from the application liquid so as to remain at 0.1 wt % or less with respect to the polymer of the alicyclic compound.

4. The method for manufacturing a semiconductor device according to claim 1, wherein the gate electrode is made of silver.

5. The method for manufacturing a semiconductor device according to claim 1, wherein the paraffin hydrocarbon solvent is made of at least one of heptane, octane, nonane, decane, undecane, dodecane, tridecane, tetradecane, pentadecane, hexadecane, and heptadecane.

* * * * *